(12) United States Patent
Jeon

(10) Patent No.: US 6,262,621 B1
(45) Date of Patent: Jul. 17, 2001

(54) VOLTAGE BOOSTING CIRCUIT FOR SEMICONDUCTOR DEVICE

(75) Inventor: Baek-Yeong Jeon, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/559,236

(22) Filed: Apr. 26, 2000

(30) Foreign Application Priority Data

Apr. 27, 1999 (KR) .................................................. 99-15080

(51) Int. Cl.[7] ...................................................... G05F 1/10
(52) U.S. Cl. .......................... 327/541; 327/537; 327/543
(58) Field of Search .................................. 327/530, 537, 327/535, 540, 541, 543, 536

(56) References Cited

U.S. PATENT DOCUMENTS

| 5,530,395 | * | 6/1996 | Ting | ...................................... | 327/543 |
| 5,742,197 | * | 4/1998 | Kim et al. | .............................. | 327/537 |
| 5,757,714 | * | 5/1998 | Choi et al. | ............................ | 365/226 |
| 5,796,293 | | 8/1998 | Yoon et al. | ............................ | 327/536 |

* cited by examiner

Primary Examiner—Jung Ho Kim
(74) Attorney, Agent, or Firm—Skjerven Morrill MacPherson LLP; David W. Heid

(57) ABSTRACT

A voltage boosting circuit of a semiconductor device is disclosed. The voltage boosting circuit includes a voltage detector, an active kicker controller, and an active kicker. The voltage detector generates a detection signal after the determining whether a potential of the signal to be boosted is higher than a boost voltage target level. The active kicker controller generates an active kicker control signal in response to the detection signal and the clock signal. The active kicker drives the signal to be boosted in response to the active kicker control signal. The voltage detector includes a current source, a number of switching devices, a current compensating circuit, and an inverter circuit. The current compensating circuit provides a compensating current proportional to a power supply voltage.

13 Claims, 9 Drawing Sheets

| VCC | | 2.20 | 3.40 | 3.60 | 3.80 | 4.00 | △(v) |
|---|---|---|---|---|---|---|---|
| VPP-A | t1=100°C | 4.00 | 5.26 | 5.47 | 5.67 | 5.88 | +1.18 |
| | t2= 25°C | 4.10 | 5.19 | 5.38 | 5.57 | 5.76 | +1.66 |
| | t3= -5°C | 4.19 | 5.17 | 5.35 | 5.52 | 5.70 | +1.51 |
| | △(v) | +0.19 | -0.09 | -0.12 | -0.15 | -0.18 | -0.37 |
| VPP-B | t1=100°C | 4.10 | 5.53 | 5.73 | 5.93 | 6.12 | +2.02 |
| | t2= 25°C | 3.95 | 5.38 | 5.59 | 5.79 | 5.99 | +2.04 |
| | t3= -5°C | 3.91 | 5.34 | 5.55 | 5.76 | 5.96 | +2.05 |
| | △(v) | -0.19 | -0.19 | -0.18 | -0.17 | -0.16 | +0.03 |

VOLTAGE BOOSTING CIRCUIT FOR SEMICONDUCTOR DEVICE

FIELD OF THE INVENTION

The present invention relates to a semiconductor device and, more particularly to a semiconductor device having a voltage boosting circuit for generating voltages that exceed the power supply voltage.

BACKGROUND OF THE INVENTION

Voltage boosting circuits are useful in semiconductor devices which often boost signal lines above power supply voltage VCC. For example, programming of non-volatile memory devices or read-write operation of dynamic random memory devices boosts word lines of the devices above power supply voltage.

FIG. 1 illustrates a voltage boosting circuit 1 of a known semiconductor device. This is disclosed in U.S. Pat. No. 5,796,293 (the '293 patent), entitled "VOLTAGE BOOSTING CIRCUITS HAVING BACKUP VOLTAGE BOOSTING CAPABILITY," which is incorporated herein by reference in its entirety. As disclosed in the '293 patent, a main voltage boosting circuit 1a and a backup voltage boosting circuit 1b constitute voltage boosting circuit 1. Main voltage boosting circuit 1a drives a signal voltage VPP when a semiconductor device including voltage boosting circuit 1 is in a standby mode, and backup voltage boosting circuit 1b drives signal voltage VPP when the semiconductor device is in an active mode. Operation of each component illustrated in FIG. 1 is fully explained in the '293 patent, and thus is briefly described herein.

Main voltage boosting circuit 1a includes a first voltage level detector 15 that generates a predetermined output VPPOSCE, an oscillator 16 that generates an internal driver signal VPPDRV, and a main pump that provides a voltage boost to a signal line that carries signal voltage VPP in response to a rising edge of internal driver signal VPPDRV. Backup voltage boosting circuit 1b includes a control signal generator 13 that responds to a clock signal PR, a second voltage level detector 18 that triggers at a voltage level greater that a predetermined reference potential at which first detector 15 is set, a latch 19 that generates a latch signal PNAKE, a first pulse generator 21 that generates a first pulse PAKEF, a first active kicker that provides a voltage boost to the signal line that carries signal voltage VPP in response to a rising edge of first pulse PAKEK. Backup voltage boosting circuit 1b further includes a delay circuit 20 that generates a signal PNAKED, a second pulse generator 22 that generates a second pulse PAKES, and a second active kicker 24 that provides a voltage boost to the signal line that carries signal voltage VPP in response to a rising edge of second pulse PNAKED.

FIG. 2 is a circuit diagram of a second detector (or an independent level detector) 18 of FIG. 1. Second detector 18 generates a logic high signal at a node 69 if signal voltage VPP drops below a target boost voltage. Output of an inverter 61 is then latched and held at each rising edge of a signal PVPPLATCH which is slightly delayed relative to the rising edge of a master clock signal PR. Accordingly, if signal voltage VPP is below the target boost voltage which second detector 18 is set to trigger, an output VPPDETA changes from low to high and remains high until signal voltage VPP is boosted above the target boost voltage.

In reliability testing of semiconductor devices, an externally applied power supply voltage (hereinafter, referred to as "an external power supply voltage") is applied to the devices. When the external power supply voltage decreases below a specific voltage for operating the devices, an internal VCC generator produces and maintains an internal power supply voltage VCC. In contrast, when the external power supply voltage increases above the specific voltage, internal power supply voltage VCC also may rise proportionally to the increase of the external power supply voltage. The latter case can cause a problem in second detector 18 as described below.

Referring to FIG. 2, as internal power supply voltage VCC increases, current flowing through an NMOS transistor 57 increases because the gate of NMOS transistor 57 is tied to internal power supply voltage VCC. Accordingly, the potential of a node N1, which is a common gate of PMOS and NMOS transistors 59 and 60, decreases as internal power supply voltage VCC increases. Then, output VPPDETA continues to remain high until voltage of signal line VPP is boosted above the target boost voltage. Thus, backup voltage boosting circuit 1b of FIG. 1 boosts signal voltage VPP until output VPPDETA changes from high to low.

Furthermore, because the gate of an NMOS transistor 58 is coupled to a signal line (not shown) that sends signal voltage VPP, the potential of node N1 decreases as signal voltage VPP increases. Then, backup voltage boosting circuit 1b of FIG. 1 further boosts signal voltage VPP even though signal voltage VPP is already above the target boost voltage. Accordingly, signal voltage VPP increases exponentially as internal power supply voltage VCC or the external power supply voltage increases.

The exponential increase of signal line voltage VPP may deteriorate electric characteristics of MOS transistors coupled to the signal line that sends signal voltage VPP. For example, gate oxide layers of the transistors may breakdown because of high electric field across the layers. Therefore, a semiconductor device having voltage boosting circuit 1 of FIG. 1 can have reduced lifetime and reliability.

SUMMARY OF THE INVENTION

A voltage boosting circuit includes a voltage detector, an active kicker controller, and an active kicker. The voltage detector receives a signal to be boosted and a clock signal and generates a detection signal after determining whether a potential of the signal to be boosted is higher than a target voltage level. The active kicker controller receives the detection signal and the clock signal and generates an active kicker control signal in response to the detection signal and the clock signal. The active kicker drives the signal to be boosted in response to the active kicker control signal.

The voltage detector includes a current source, a number of switching devices, a current compensating circuit, and an inverter circuit. The inverter circuit outputs the detection signal. The current compensating circuit provides a compensating current proportional to a power supply voltage. The current compensating circuit connects to the current source and includes switching devices and optional devices. The switching devices are MOS transistors.

BRIEF DESCRIPTION OF THE DRAWINGS

The features and advantages of the present invention will become apparent by describing in detail specific embodiments with reference to the attached drawings, in which.

Use of same reference symbols in different figures indicates similar or identical items.

DESCRIPTION OF THE PREFERRED EMBODIMENT

Figure 3:
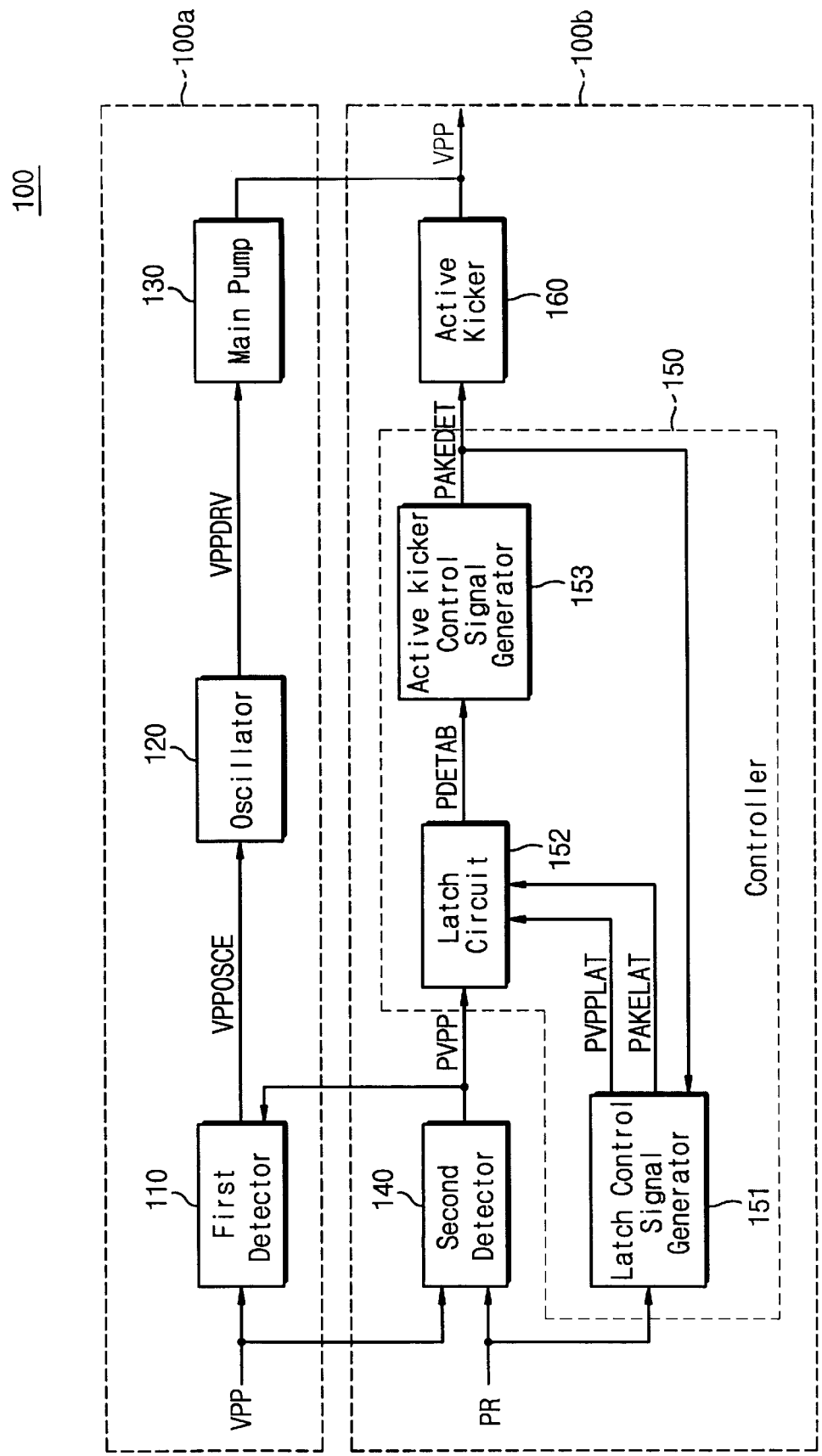
FIG. 3 is a block diagram of a voltage boosting circuit in accordance with an embodiment of the present invention.

FIG. 3 illustrates a voltage boosting circuit 100 of a semiconductor device according to an embodiment of the present invention. Voltage boosting circuit 100 includes a first voltage boosting circuit 100a and a second voltage boosting circuit 100b. Both voltage boosting circuits 100a and 100b collectively drive a signal voltage VPP to a voltage exceeding a power supply voltage VCC and connect to a signal line (not shown) that carries a signal voltage VPP. First voltage boosting circuit 100a includes a first detector 110, an oscillator 120, and a main pump 130. In a standby mode, first detector 110 generates a first detection signal VPPOSCE at a logic high level when the voltage of signal voltage VPP is below a target voltage. Oscillator 120 generates a main pump driving signal VPPDRV in response to first detection signal VPPOSCE, and main pump 130 drives signal voltage VPP in response to main pump driving signal VPPDRV.

Figure 4:
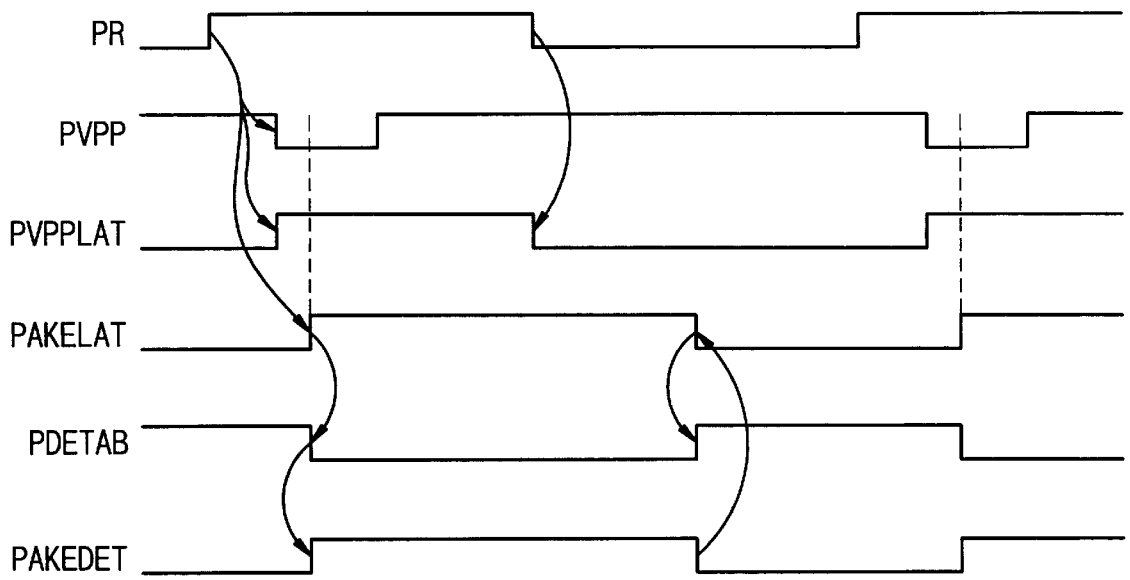
FIG. 4 is a signal timing diagram illustrating operation of a second voltage boosting circuit of the voltage boosting circuit of FIG. 3.

Second voltage boosting circuit 100b includes a second detector 140, an active kicker controller 150, and an active kicker 160. In an active mode, second detector 140 responds to a clock signal (or a master clock signal) PR, and generates a second detection signal PVPP of a logic low level when signal voltage VPP is below the target voltage. Active kicker controller 150 generates an active kicker control signal PAKEDET in response to clock signal PR and second detection signal PVPP. Active kicker 160 drives signal voltage VPP in response to active kicker control signal PAKEDET. Active kicker controller 150 includes a latch control signal generator 151, a latch circuit 152, and an active kicker control signal generator 153. FIG. 4 illustrates timing of signals of second voltage boosting circuit 100b.

Figure 1:
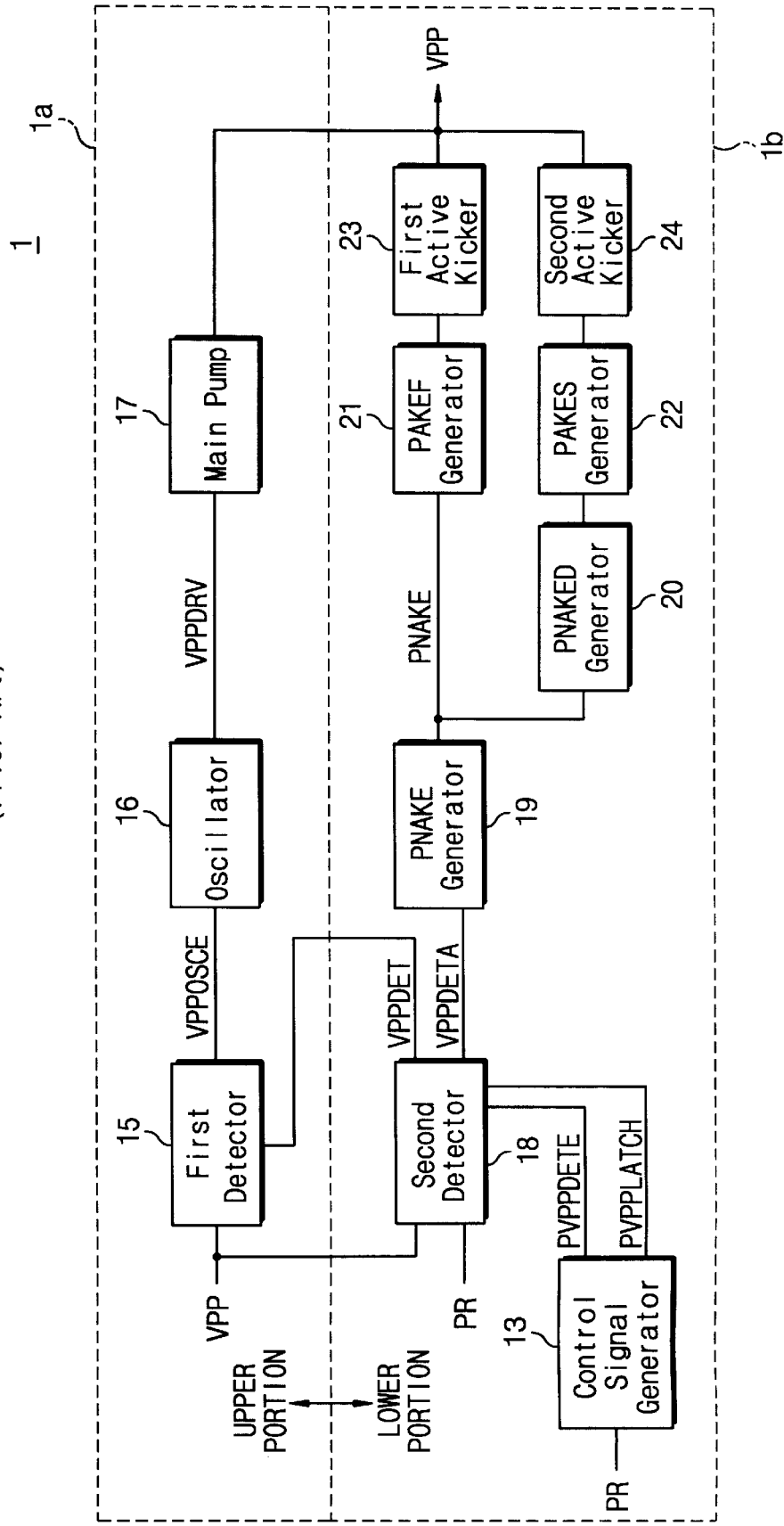
FIG. 1 is a block diagram of a known voltage boosting circuit.
Figure 2:
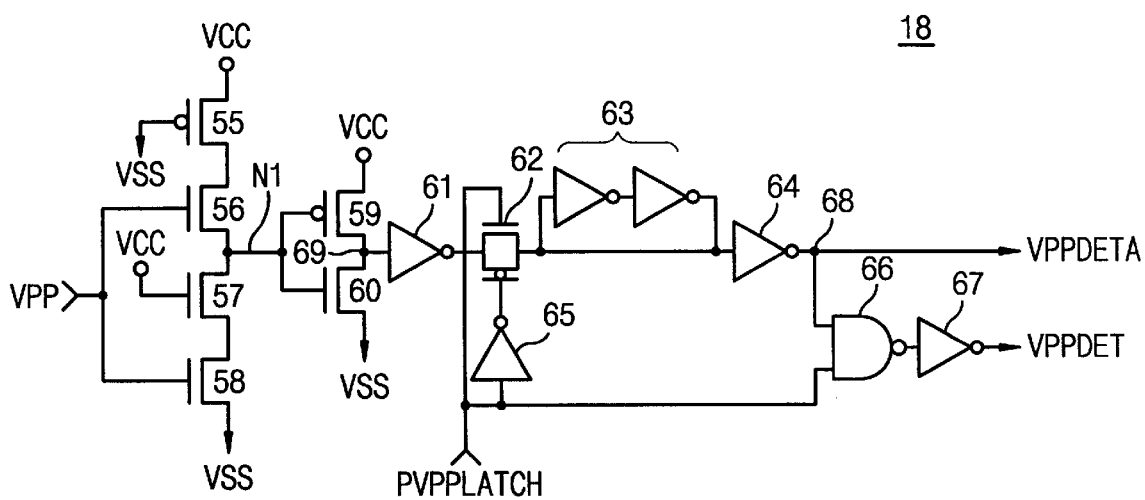
FIG. 2 is a circuit diagram of a second detector of FIG. 1.
Figure 5:
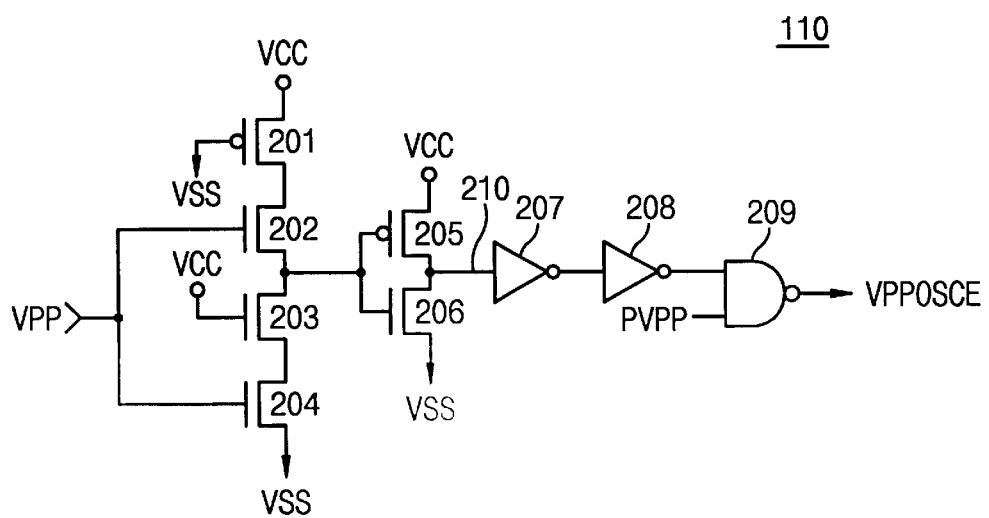
FIG. 5 is a circuit diagram of a first detector of the voltage boosting circuit of FIG. 3.

FIG. 5 is a circuit diagram of first detector 110 of FIG. 3. Referring to FIGS. 3 and 5, first detector 110 generates first detection signal VPPOSCE of a logic high level when signal voltage VPP (or referred to as "a boost voltage") is below the target voltage in standby mode. Accordingly, on-resistances of NMOS and PMOS transistors 201 to 206 is accurately designed so as to produce a logic low level at a node 210. Then, main pump 130 drives signal voltage VPP in response to main pump driving signal VPPDRV from oscillator 120 which operates in response to first detection signal VPPOSCE. Oscillator 120 and main pump 130 may have the same configuration as oscillator 16 and main pump 17 of FIG. 1, and thus detailed description oscillator 120 and main pump 130 is omitted herein.

Figure 6:
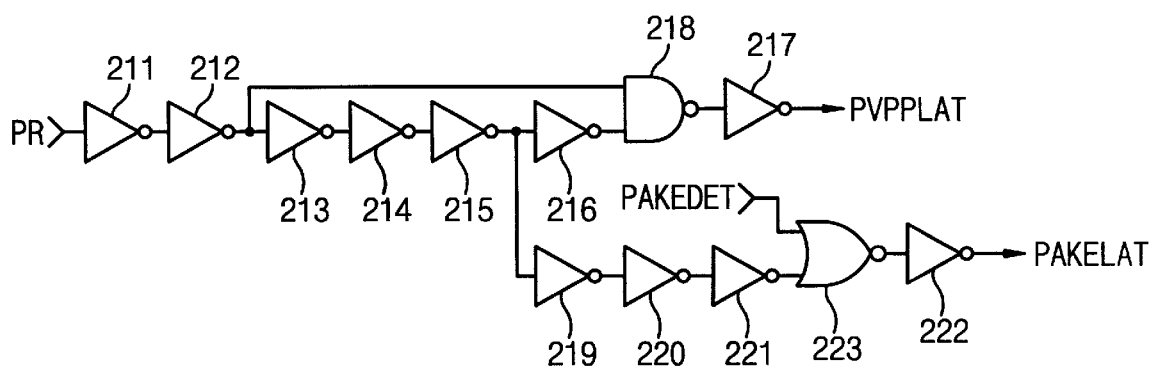
FIG. 6 is a circuit diagram of a latch control signal generator of the voltage boosting circuit of FIG. 3.
Figure 7:
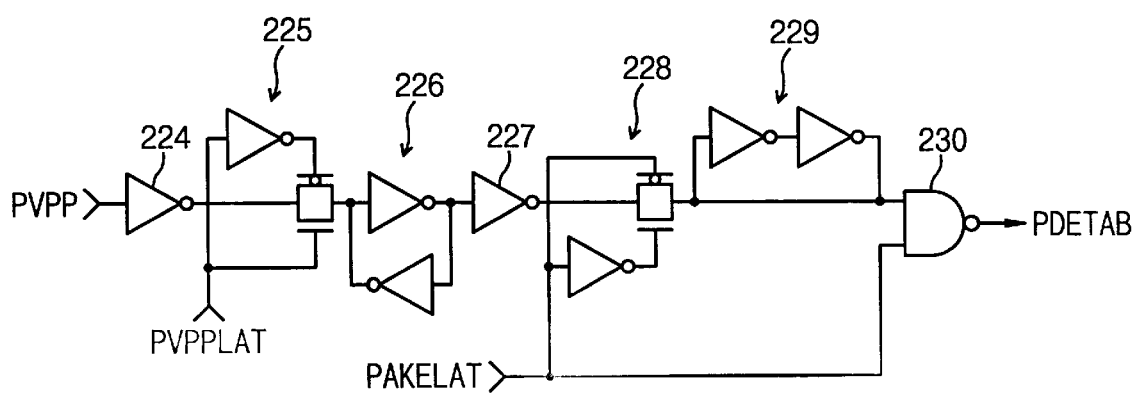
FIG. 7 is a circuit diagram of a latch circuit of the voltage boosting circuit of FIG. 3.
Figure 8:
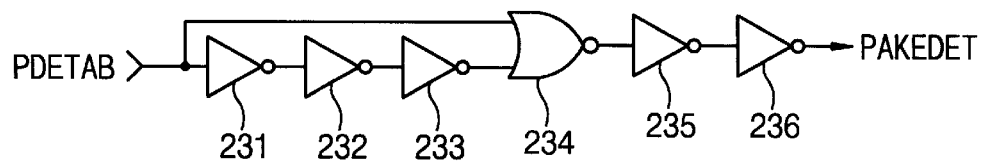
FIG. 8 is a circuit diagram of an active kicker control signal generator of the voltage boosting circuit of FIG. 3.

Referring to FIGS. 6 to 8, latch control signal generator 151, latch circuit 152, and active kicker control signal generator 153 of FIG. 3 are described. Latch control signal generator 151, after receiving clock signal PR, generates first and second latch control signals PVPPLAT and PAKELAT. Control signal generator 151 of FIG. 4 generates first latch control signal PVPPLAT, which is the same as clock signal PR except that each rising edge (low-to-high transition) of first latch control signal PVPPLAT trails that of clock signal PR with a delay. This delay is associated with seven invertors 211 to 217, and a NAND gate 218 of latch control signal generator 151. FIG. 4 also shows that each rising edge of second latch control signal PAKELAT trails that of clock signal PR by a delay. This delay is associated with nine inverters 211 to 215 and 219 to 222, and a NOR gate 223. Control signal generator 151 of FIG. 4 inactivates second latch control signal PAKELAT from high to low when active kicker control signal PAKEDET changes from high to low.

Referring to FIG. 7, latch circuit 152 of FIG. 3 receives second detection signal PVPP from second detector 140 and generates an output PDETAB in response to latch control signals PVPPLAT and PAKELAT. When signal PVPPLAT is at logic high level, a transmission gate 225, which includes an inverter, a PMOS transistor and an NMOS transistor, turns on, and second detection signal PVPP is latched and held in a latch 226 of latch circuit 152 through an inverter 224. Then, when second latch control signal PAKELAT is at logic low level, a transmission gate 228 turns on, and the signal from latch 226 is latched and held in a latch 229. Next, when signal PAKELAT changes from low to high, a NAND gate 230 drops signal PDETAB to a logic low level if latch 229 hold a signal that is at the logic high level, and, at the same time, transmission gate 228 turns off and block the signal from latch 226 of the previous stage. Accordingly, signal PDETAB is high when signal PAKELAT is low, as illustrated in FIG. 4.

FIG. 8 illustrates active kicker control signal generator 153 of FIG. 3. Referring to FIGS. 3, 4, and 8, when signal PDETAB from latch circuit 152 changes from logic high to logic low, active kicker control signal PAKEDET pulses from logic low to logic high, and active kicker 160 drives signal voltage VPP in response to the pulse in signal PAKEDET. As illustrated in FIG. 4, after a lapse, active kicker control signal PAKEDET changes from high to low, and then signals PAKELAT and PDETAB are inactivated low and high in that order, respectively.

Figure 9A:
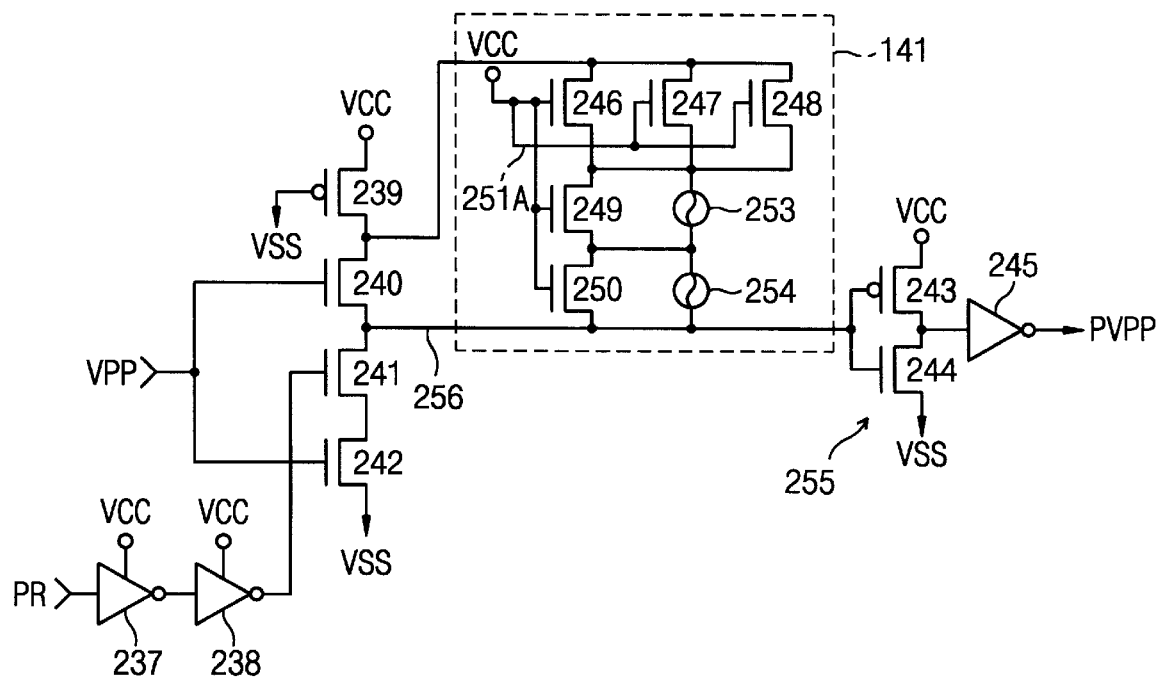
FIGS. 9A and 9b are circuit diagrams of different configurations of a second detector of the voltage boosting circuit of FIG. 3.

Second detector 140 operates in response to clock signal PR, and generates second detection signal PVPP by detecting whether signal voltage VPP is below the target voltage in active mode. As shown in FIG. 9A, second detector 140 includes two PMOS transistors 239 and 243, four NMOS transistors 240, 241, 242 and 244, and three inverters 237, 238 and 245. PMOS transistor 239 acts as a current source, and PMOS and NMOS transistors 243 and 244 constitute an invertor circuit 255 which is set to trigger at a predetermined logic threshold voltage level, for example, 1 volt. Invertors 245 and 255 determine whether to activate second detection signal PVPP. The logic threshold voltage $V_{LT}$ may be determined by a following equation.

$$V_{LT} = \frac{Vtn + Vcc - |Vtp| \times \sqrt{\kappa}}{1 + \sqrt{\kappa}}$$

In the above equation, Vtn and Vtp respectively indicate threshold voltages of an NMOS transistor and a PMOS transistor, and κ (=βp/βn) is a voltage transfer function.

For the purpose of explaining operation of second voltage boosting circuit 110b of voltage boosting circuit 100 of FIG. 3, it is assumed that a semiconductor device including voltage boosting circuit 100 is in active mode. Referring to FIGS. 3 and 9, when signal voltage VPP drops below the target voltage in the active mode, the voltage of a node 256 becomes lower than the logic threshold voltage level $V_{LT}$ of inverter circuit 255. Then, inverters 245 and 255 determine to activate second detection signal PVPP at logic low, and active kicker 160 drives (or boosts) signal voltage VPP via latch circuit 152 and active kicker control signal generator 153. When the boosted signal voltage VPP rises above the target voltage, the voltage of node 256 becomes higher than the logic threshold voltage level $V_{LT}$ of inverter circuit 255. Then, second detection signal PVPP becomes inactivated at logic high, so that active kicker 160 is disabled.

Figure 9B:
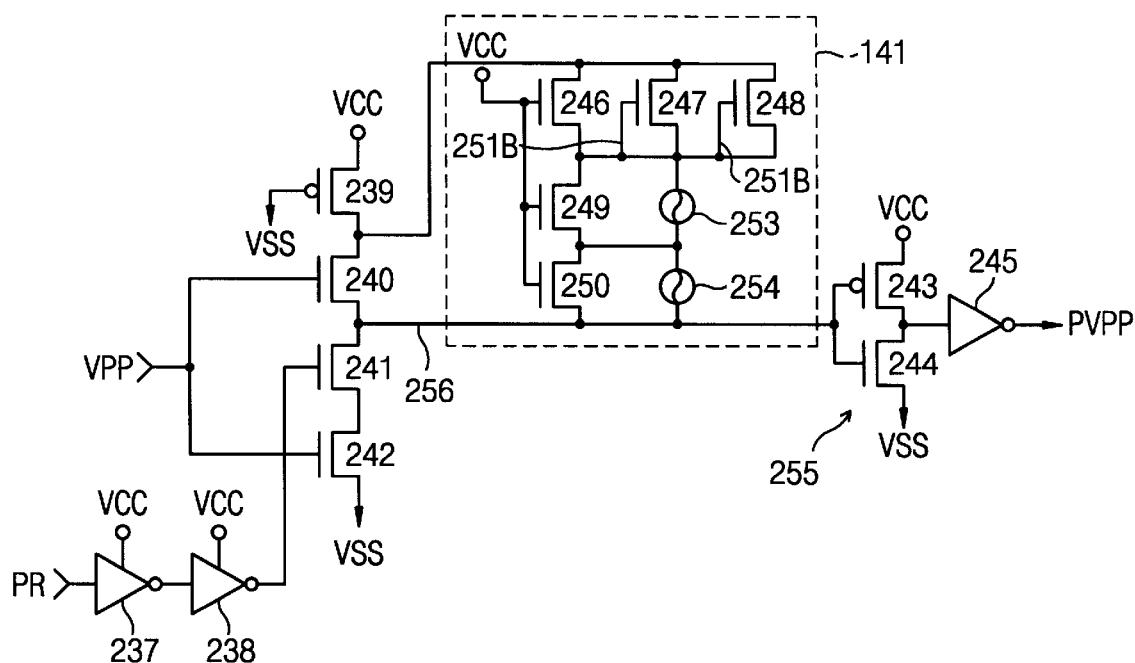

Referring to FIGS. 9A and 9B, second detector 140 further includes a current compensating section 141. Current compensating section 141 prevents the exponential increase of signal voltage VPP of voltage boosting circuit 1 of FIG. 1. As described above, in voltage boosting circuit 1, signal voltage VPP can increase exponentially as internal power supply voltage VCC or the external power supply voltage increases. Current compensating section 141 is coupled to node 256 and to the drain of PMOS transistor 239 which is a current source.

Current compensating section 141 includes five NMOS transistors 246 to 250, a configurable metal line 251A or 251B, and two fuse elements 253 and 254. NMOS transistors 246, 249, and 250 are serially connected between the drain of transistor 239 and node 256. The gates of NMOS transistors 246, 249, and 250 are coupled in common to internal power supply voltage VCC. Fuse elements 253 and 254 are connected in parallel to NMOS transistors 249 and 250, respectively.

In the configuration of FIG. 9A, metal line 251A connects the gates of NMOS transistors 247 and 248 to supply voltage VCC, and fuses 253 and 254 are left intact. With this configuration, transistors 246, 247, and 248 in parallel conduct current from the drain of PMOS transistor 239, and that current flows directly through fuses 253 and 254 to node 256.

In the configuration of FIG. 9B, the metal line 251B connects the gates of NMOS transistors 247 and 248 to the sources of transitors 246, 247, and 248. Accordingly, transistors 247 and 248 do not conduct current. This reduces the current to node 256. Additionally, fuses 253 and 254 are cut. With this configuration, current flows from the drain of PMOS transistor 239 serially through NMOS transistors 246, 249, and 250. The serial rather than parallel current flow causes the current through current compensating section 241 to be smaller for the configuration of FIG. 9B than for the configuration of FIG. 9A.

Current compensating section 141 decelerates the increase of signal voltage VPP by supplying compensating current to node 256. Depending on the electrical characteristics of device 100 (FIG. 3), metal line 251A or 251B and two fuse elements 253 and 254 are selectively employed to control the amount of the compensating current. For instance, when testing of an IC indicates a small compensating current is sufficient, the manufacturing process cuts fuses 253 and 254 are cut and forms a metal pattern including metal lines 251B of FIG. 9B. When more compensating current is necessary, metal line 251A is formed, and fuses 253 and 254 are not cut.

Assume that internal power supply voltage VCC increases during a test. Since clock signal PR (and inverters 237 and 238) apply power supply voltage VCC to the gate of NMOS transistor 241, current flowing through NMOS transistor 241 increases in proportion to power supply voltage VCC. At the same time, compensating current corresponding to the current flowing through NMOS transistor 241 to node 256 through at least through NMOS transistor 246, which has a gate connected to the power supply voltage VCC. Accordingly, current compensating section 141 prevents the voltage on node from falling as quickly, so that signal voltage VPP increases slowly (by a avoiding a condition where signal PVPP is constantly active). The compensating current supplied to node 256 is in proportion to the current flowing through NMOS transistor 241.

Figures 10, 11A:
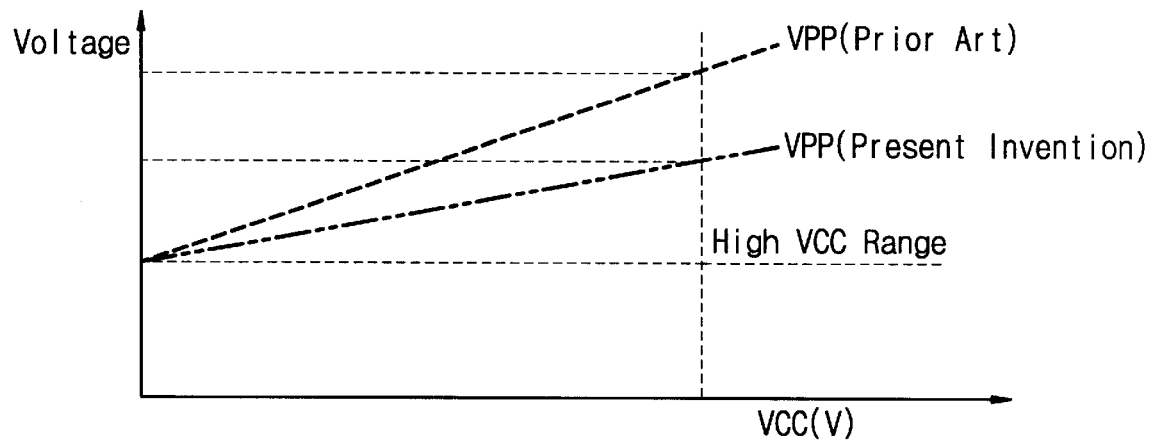
FIG. 10 is a graph illustrating the relationship between signal voltage and internal power supply voltage.
FIGS. 11A to 11C are a table and graphs illustrating signal voltage changes at various temperatures and power supply voltages.

As shown in FIG. 10, the increase of signal voltage VPP with increasing power supply voltage VCC is decelerated. This slow increase of signal voltage VPP may enhance the lifetime and reliability of a semiconductor device.

Second detector 140 can adjust the target voltage of voltage boosting circuit 100. In particular, when fuse elements 253 and 254 are not cut and metal line 251A is formed, the voltage of node 256 remains higher than when fuse elements 253 and 254 are cut and metal line 251B is formed. Accordingly, second detection signal PVPP remains high even though the boosted voltage falls below the normal target voltage. As a result, active kicker 160 becomes inactivated, and signal voltage VPP decreases. Accordingly, when fuse elements 253 and 254 are not cut and metal line 251A is formed, the target voltage is at a lower level than when fuse elements 253 and 254 are cut and metal line 251B is formed.

In contrast, when fuse elements 253 and 254 are cut, voltage on node 256 is on average lower than in the case when fuse elements 253 and 254 are not cut. Accordingly, second detection signal PVPP remains low though the boosted voltage is higher than the target voltage. As a result, active kicker 160 becomes activated, and signal voltage VPP increases. Accordingly, the target voltage is set at a higher level.

Figure 11B:
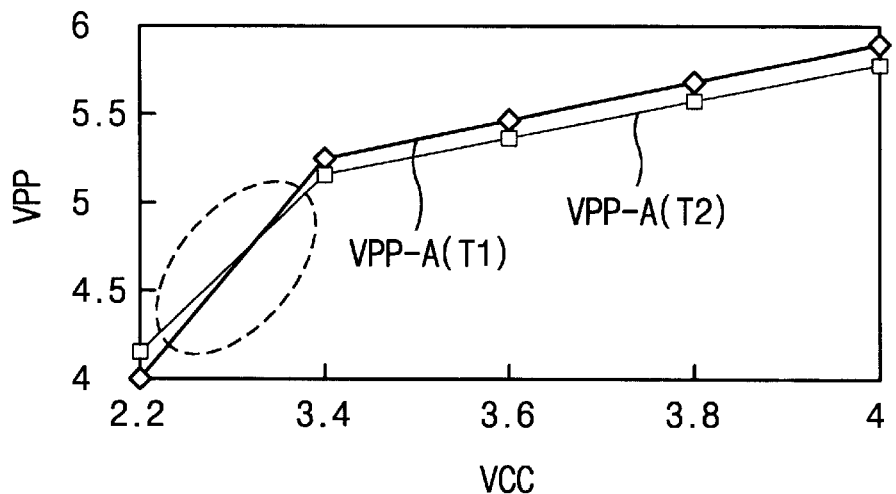
Figure 11C:
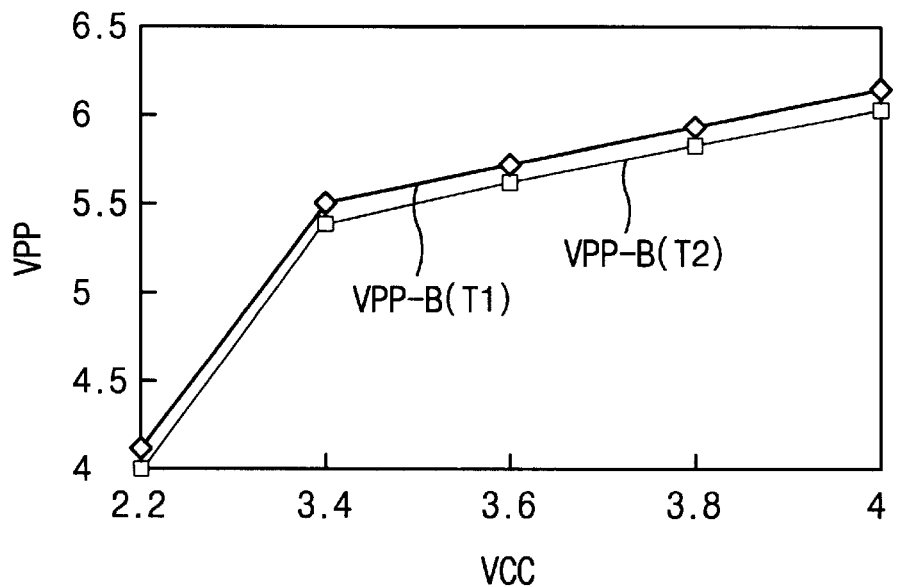

As shown in FIGS. 11A to 11C, second detector 140 improves temperature characteristics of the semiconductor device having voltage boosting circuit 100, in which the gate oxide of MOS transistors has a thickness of about 60–80 Å. FIG. 11A illustrates boosted signal VPP-A of a semiconductor device including a prior art voltage boosting circuit and boosted signal VPP-B of a semiconductor device including a voltage boosting circuit according to the present invention. The boosted signal signals VPP-A and VPP-B were measured at temperatures T1 (100° C.), T2 (25° C.) and T3 (−5° C.) and different power supply voltages.

As illustrated in FIG. 11B, when the power supply voltage is at 2.2 volts, the boosted voltage VPP-A is 4 volts at T1 and 4.1 volts at T2. When the power supply voltage is at 3.4 volts, the boosted voltage VPP-A is 5.26 volts at T1 and 5.19 volts at T2. In the voltage range of 2.2–3.4 volts, which is marked by a dotted line, the boosted voltage VPP-A at T1 increases more rapidly than the boosted voltage VPP-A at T2. This difference of voltage increasing ratio causes the MOS transistors to perform the unexpected operations, reducing the reliability of the semiconductor device having the prior art voltage boosting circuit. On the other hand, as illustrated in the FIG. 11C, the boosted voltage VPP-B changes in uniform fashion at T1 and T2, improving the reliability of the semiconductor device having the voltage boosting circuit according to the present invention.

Although the invention has been described with reference to particular embodiments, the description is only an example of the inventor's application and should not be taken as limiting. Various adaptations and combinations of features of the embodiments disclosed are within the scope of the invention as defined by the following claims.

What is claimed is:

1. A voltage detecting circuit of a semiconductor device comprising:
    a current source having a first end connected to a first power supply voltage source and a second end, the first power supply voltage source supplying a first power supply voltage;
    a first switching device having a first terminal coupled to the second end of the current source, a second terminal receiving a boost voltage used in the semiconductor device, and a third terminal coupled to a node;
    a second switching device having a first terminal connected to the node, a second terminal connected to the first power supply voltage source, and a third terminal;
    a third switching device having a first terminal connected to the third terminal of the second switching device, a second terminal receiving the boost voltage, and a third terminal coupled to a second power supply voltage; and
    a current compensating circuit that provides to the node a compensating current proportional to the first power supply voltage, the current compensating circuit connecting to the second end of the current source and the node.

2. The voltage detecting circuit according to claim 1, further comprising an inverter circuit coupled to the node, so that the inverter circuit outputs a detection signal when a potential of the node is lower than a preset logic threshold voltage level of the inverter circuit.

3. The voltage detecting circuit according to claim 1, wherein the current compensating circuit comprises a fourth switching device having a first terminal coupled to the second end of the current source, a second terminal coupled to the first power supply voltage source, and a third terminal, wherein the first terminal of the first switching device is coupled to the third terminal of the fourth switching device.

4. The voltage detecting circuit according to claim 1, wherein the current compensating circuit comprises:
    a fifth switching device having a first terminal coupled to the second end of the current source, a second terminal coupled to the first power supply voltage source, and a third terminal;
    a sixth switching device having a first terminal coupled to the third terminal of the fifth switching device, a second terminal coupled to the first power supply voltage source, and a third terminal coupled to the node;
    a first option device coupled between the first and third terminals of the fifth switching device; and
    a second option device coupled between the first and third terminals of the sixth switching device.

5. The voltage detecting circuit according to claim 4, wherein the current compensating circuit further comprises:
    a seventh switching device having a first terminal coupled to the second end of the current source, and second and third terminals collectively coupled to the node through the first and second option devices; and
    an eighth switching device having a first terminal coupled to the second end of the current source, and second and third terminals collectively coupled to the node through the first and second option devices.

6. The voltage detecting circuit according to claim 5, further comprising an optional metal line that connects the second terminals of the seventh and eighth switching devices to the first power supply voltage source.

7. The voltage detecting circuit according to claim 5, wherein the first to eighth switching devices are NMOS transistors.

8. A voltage boosting circuit of a semiconductor device, comprising:
    a voltage detector that receives a signal to be boosted and a clock signal, wherein the voltage detector detects whether a potential of the signal to be boosted is higher than a target voltage level and generates a detection signal after the detecting;
    an active kicker controller that receives the detection signal and the clock signal and generates an active kicker control signal in response to the detection signal and the clock signal; and
    an active kicker that drives the signal to be boosted in response to the active kicker control signal, wherein the voltage detector comprises:
    a current source having a first end connected to a first power supply voltage source and a second end, the first power supply voltage source supplying a first power supply voltage;
    a first switching device having a first terminal coupled to the second end of the current source, a second terminal receiving a boost voltage used in the semiconductor device, and a third terminal coupled to a node;
    a second switching device having a first terminal connected to the node, a second terminal connected to the first power supply voltage source, and a third terminal;
    a third switching device having a first terminal connected to the third terminal of the second switching device, a second terminal receiving the boost voltage, and a third terminal coupled to a second power supply voltage;
    a current compensating circuit that provides to the node a compensating current proportional to the first power supply voltage, the current compensating circuit connecting to the second end of the current source and the node; and an inverter circuit coupled to the node, so that the inverter circuit outputs the detection signal when a potential of the node is lower than a preset logic threshold voltage level of the inverter circuit.

9. The voltage boosting circuit according to claim 8, wherein the current compensating circuit comprises a fourth switching device having a first terminal coupled to the second end of the current source, a second terminal coupled to the first power supply voltage source, and a third terminal, wherein the first terminal of the first switching device is coupled to the third terminal of the fourth switching device.

10. The voltage boosting circuit according to claim 9, wherein the current compensating circuit section further comprises:
    a fifth switching device having a first terminal coupled to the second end of the current source, a second terminal coupled to the first power supply voltage source, and a third terminal;
    a sixth switching device having a first terminal coupled to the third terminal of the fifth switching device, a second terminal coupled to the first power supply voltage source, and a third terminal coupled to the node;

a first option device coupled between the first and third terminals of the fifth switching device; and a second option device coupled between the first and third terminals of the sixth switching device.

11. The voltage boosting circuit according to claim 10, wherein the current compensating circuit section further comprises:

a seventh switching device having a first terminal coupled to the second end of the current source, and second and third terminals collectively coupled to the node through the first and second option devices; and an eighth switching device having a first terminal coupled to the second end of the current source, and second and third terminals collectively coupled to the node through the first and second option devices.

12. The voltage boosting circuit according to claim 11, further comprising an optional metal line that connects the second terminals of the seventh and eighth switching devices to the first power supply voltage source.

13. The voltage detecting circuit according to claim 11, wherein the first to eighth switching devices are MOS transistors.

* * * * *